United States Patent [19]

Otsuka

[11] 4,322,652

[45] Mar. 30, 1982

[54] PIEZOELECTRIC RESONATOR SUPPORT WITH DIRECTION-ORIENTED CONDUCTIVE PLASTIC PLATE

[75] Inventor: Eizo Otsuka, Yokohama, Japan

[73] Assignee: Murata Manufacturing Co., Ltd., Japan

[21] Appl. No.: 41,899

[22] Filed: May 23, 1979

[30] Foreign Application Priority Data

Aug. 12, 1978 [JP] Japan ................................ 53-98590

[51] Int. Cl.$^3$ ............................................ H01L 41/08
[52] U.S. Cl. ........................................ 310/345; 310/318; 310/354; 310/355; 310/363
[58] Field of Search .............................. 310/354–356, 310/348, 363, 345, 364, 314–319; 333/183, 185, 186

[56] References Cited

U.S. PATENT DOCUMENTS

| | | | |
|---|---|---|---|
| 3,313,891 | 4/1967 | Wood | 310/330 X |
| 3,560,772 | 2/1971 | Lungo | 310/345 X |
| 3,836,794 | 9/1974 | Shimizu et al. | 310/363 X |
| 3,851,194 | 11/1974 | Kawada | 310/345 |
| 3,885,173 | 5/1975 | Lee | 310/345 X |
| 4,068,032 | 1/1978 | Alonso | 310/363 X |

*Primary Examiner*—Mark O. Budd

[57] ABSTRACT

A piezoelectric filter comprises a piezoelectric substrate having separate first and second electrode layers formed on one surface thereof and a common electrode layer formed on the opposite surface thereof, first and second terminal members, and a common terminal member electrically connected to the common electrode layer. The first and second terminal members are electrically connected to the first and second electrode layers through different local areas of a direction-oriented electroconductive plastic sheet capable of exhibiting its electroconductivity in a predetermined direction across the thickness thereof. An ordinary electroconductive rubber sheet may be positioned between the common terminal member and the common electrode layer.

8 Claims, 26 Drawing Figures

Fig. 1 Prior Art
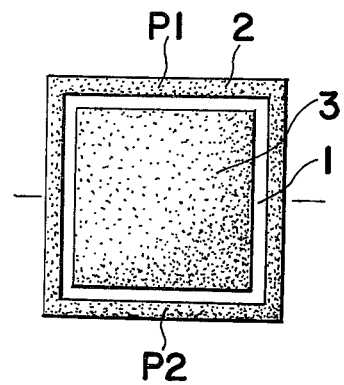
Fig. 2 Prior Art
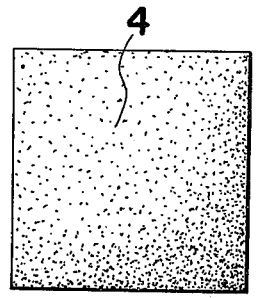
Fig. 3 Prior Art
Fig. 4 (a) Prior Art
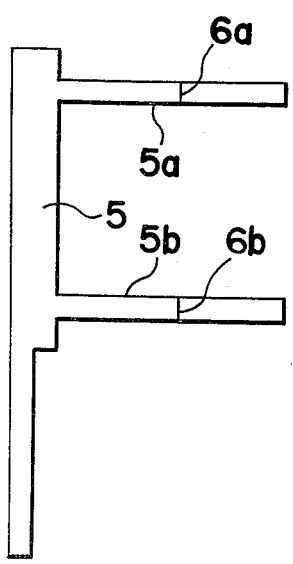
Fig. 5 (a) Prior Art
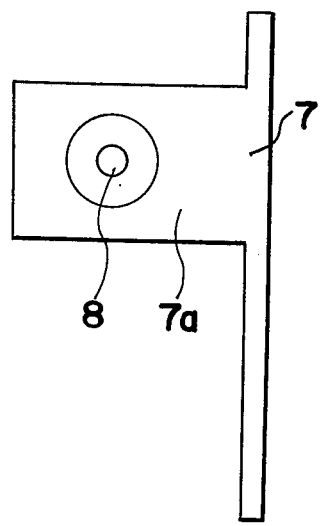
Fig. 6 (a) Prior Art
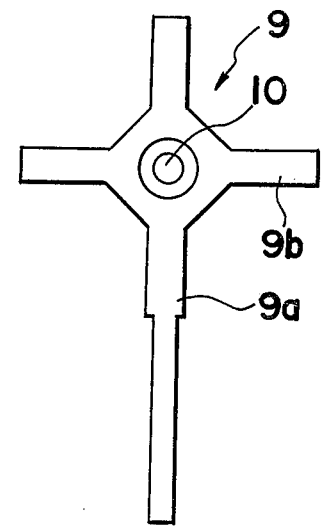
Fig. 4 (b) Prior Art
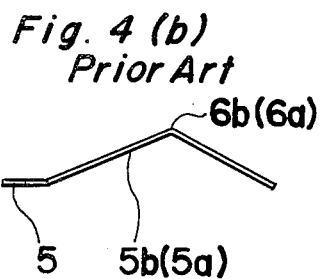
Fig. 5 (b) Prior Art
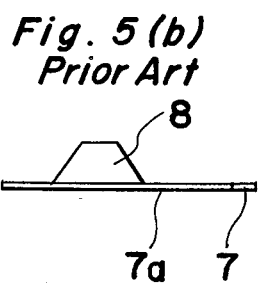
Fig. 6 (b) Prior Art
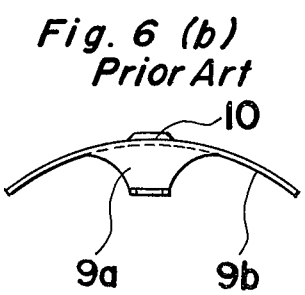

PIEZOELECTRIC RESONATOR SUPPORT WITH DIRECTION-ORIENTED CONDUCTIVE PLASTIC PLATE

BACKGROUND OF THE INVENTION

The present invention generally relates to a piezoelectric filter and, more particularly, to a piezoelectric filter of a type having three terminal elements.

There is known a piezoelectric filter of a type having three terminal elements, an example of which is disclosed in Japanese Laid-open Patent Publication No. 52-110547 and Japanese Laid-open Utility Model Publications No. 52-122630, No. 52-122631 and No. 52-122632, all of which were laid open to public inspection in 1977, and shown in FIGS. 1 to 8 of the accompanying drawings. Referring to FIGS. 1 to 7, the prior art piezoelectric filter comprises a piezoelectric substrate 1 of a square shape having one face deposited or coated with an outer electrode layer 2 and a center electrode layer 3 concentric with and electrically insulated from the outer electrode layer 2, as best shown in FIG. 1, the opposite face of said piezoelectric substrate 1 being deposited or coated with a common ground electrode layer 4, as best shown in FIG. 2. The substrate assembly having the piezoelectric substrate 1 and the electrode layers 2, 3 and 4 is shown in sectional view in FIG. 3.

Shown in FIG. 4(a) is a first elongated terminal member 5 having a pair of electroconductive elastic tongues 5a and 5b extending in the same direction at right angles to the first elongated terminal member 5 and parallel to each other, said elastic tongues 5a and 5b being spaced from each other a predetermined distance which corresponds to the space between the opposite side portions of the square shaped surrounding electrode layer 2. As best shown in FIG. 4(b), each of the elastic tongues 5a and 5b is bent to provide a contact area 6a or 6b which, when in an assembled condition as shown in FIG. 7 and as will be described later, contact a respective area P1 or P2 of the opposite side portions of the surrounding electrode layer 2.

Shown in FIG. 5(a) is a second terminal member 7 having an electroconductive arm 7a protruding laterally from the terminal member 7 and having a contact protuberance 8 defined therein as best shown in FIG. 5(b). The electroconductive arm 7a is of such a size that, when in the assembled condition as shown in FIG. 7, it can be located, electrically insulated from the first terminal member 5, within a space defined by the first terminal member 5 and its elastic tongues 5a and 5b with the contact protuberance 8 held in contact with the center electrode layer 3.

Shown in FIG. 6(a) is a common terminal member 9 comprising a long and a short electroconductive bar 9a and 9b, respectively, which extend at right angles to each other to assume a substantially cross shape. Common terminal member 9 has a contact protuberance 10 defined therein and protruding outwards from the intersection area of the bars 9a and 9b, as best shown in FIG. 6(b). This common terminal member 9 is, as best shown in FIG. 6(b), substantially spherically curved with the contact protuberance 10 located at the top of the spherical shape of the common terminal member 9 so that the common terminal member 9 is resilient against pressure exerted on it in a direction opposite to the direction of projection of the contact protuberance 10.

These component parts described with reference to and shown in FIGS. 1 to 6 are assembled together in a manner as shown in FIG. 7 and housed in a casing 14 that may comprise similar casing halves 14a and 14b of a substantially container-like shape. More specifically, the substrate assembly including the piezoelectric substrate 1 and the electrode layers 2, 3 and 4, is supported in position within the casing 14 by means of the terminal members 5, 7 and 9 in such a manner that a resilient force is exerted by the terminal member 9 on the substrate assembly through the contact protuberance 10, which contacts the ground electrode layer 4, while the contact protuberance 8 of the terminal member 7 is held in tight contact with the center electrode layer 3. Thus, by the resilient action of the terminal member 9, the substrate assembly is firmly sandwiched in position between the contact protuberances 10 and 8 within the casing 14. Furthermore, the contact areas 6a and 6b of the elastic tongues 5a and 5b of the terminal member 5 are held in contact with the respective contact areas P1 and P2 of the opposite side portions of the outer electrode layer 2 by the resilient action of the elastic tongues 5a and 5b. It is to be noted that the resilient force exerted by the elastic tongues 5a and 5b is smaller than the resilient force exerted by the terminal member 9. More specifically, in the prior art filter of the construction particularly shown in FIG. 7, the resilient force exerted by the elastic tongues 5a and 5b is so selected as to be between ¼ and ½ of the resilient force exerted by the terminal member 9. The reason for this is that, since the contact areas P1 and P2 correspond to loops of mechanical vibration of the piezoelectric substrate 1, when the contact areas P1 and P2 are strongly pressed by the contact areas 6a and 6b, respectively, the mode of vibration occurring in the piezoelectric substrate 1 will adversely be affected to such an extent as to cause both the insertion loss and the center frequency to vary as shown in FIG. 8. It is to be noted that in the graph of FIG. 8 the term "contact pressure ratio" means the ratio of the pressure between contact of the contact areas 6a, 6b and the contact areas P1, P2 to the pressure of contact between the contact protuberance 10 and the ground electrode layer 4 in alignment with the contact protuberance 8.

In the prior art piezoelectric filter of the construction described with reference to and shown in FIGS. 1 to 7, selection of the optimum resilience to be exerted by the elastic tongues 5a and 5b involves a certain difficulty. If their resilience is relatively but not excessively low, the piezoelectric filter will exhibit favorable performance characteristics, but its resistance to vibration and impact will be lowered. Conversely, if the resilience exerted by the terminal member 5 is high, the resistance of the filter to vibration and impact will be improved, but the filter will no longer exhibit favorable performance characteristics. In addition, the complexity of the design and manufacture of the prior art piezoelectric filter significantly increases manufacturing cost.

SUMMARY OF THE INVENTION

The present invention has been made with the aim of substantially eliminating the disadvantages and inconveniences inherent in the prior art piezoelectric filter and has for its essential object to provide an improved piezoelectric filter, the design and manufacture of which can readily be carried out without increasing its size compared to the prior art.

Another important object of the present invention is to provide an improved piezoelectric filter of the type referred to above with relatively high resistance to vibration and impact.

A further object of the present invention is to provide an improved piezoelectric filter of the type referred to above, the manufacture of which can be automated because of the employment of a unique support system for the piezoelectric substrate.

A still further object of the present invention is to provide an improved piezoelectric filter of the type referred to above, wherein the unique support system effectively compensates for any variation in the component parts, particularly the terminal members, of the filter.

A still further object of the present invention is to provide an improved piezoelectric filter of the type referred to above, which employs relatively thin electrode layers and which can, as a result, be manufactured at a substantially reduced cost without its performance being lowered.

A still further object of the present invention is to provide an improved piezoelectric filter of the type referred to above, exhibiting an improved shape factor without its characteristic being substantially damped.

A still further object of the present invention is to provide an inexpensive improved piezoelectric filter of the type referred to above which is stable in operation and compact in size.

According to the present invention, an essential feature resides in the employment of a direction-oriented electroconductive plastic sheet between the first and second terminal members and overlying the center and outer electrode layers on the face of the piezoelectric substrate.

The term "direction-oriented electroconductive plastic sheet", as used herein, is to be understood as meaning an electroconductive pliable sheet having the property of being electroconductive in one predetermined direction, viz. across the thickness of the pliable sheet, in contrast to an ordinary electroconductive pliable sheet which is electroconductive in all directions. The direction-oriented electroconductive plastic sheet is a recent development and very few years have passed since it was made available commercially. The direction-oriented electroconductive plastic sheet is generally made of a sheet of silicone rubber containing electroconductive material, for example, metallic particles, carbon particles or metallic fibers, dispersed therein in a predetermined arrangement, and is currently commercially available in two types. One type is an anisotropically electroconductive plastic sheet exhibiting electroconductivity only across the thickness of the plastic sheet, while the other type is a pressure-conductive plastic sheet exhibiting electroconductivity only in one predetermined direction and only when external pressure is applied to the plastic sheet.

Because of the utilization of the direction-oriented electroconductive plastic sheet, the relatively complicated design of the terminal members required to provide the necessary resilience in the prior art piezoelectric filter is no longer required.

BRIEF DESCRIPTION OF THE DRAWINGS

These and other objects and features of the present invention will become apparent from the following description of the preferred embodiments thereof with reference to the accompanying drawings, in which:

FIG. 1 is a front elevational view of the piezoelectric substrate employed in the prior art piezoelectric filter;

FIG. 2 is a rear elevational view of the piezoelectric substrate shown in FIG. 1;

FIG. 3 is a side sectional view of the piezoelectric substrate shown in FIG. 1;

FIGS. 4(a), 5(a) and 6(a) are front elevational views of the first, second and common terminal members used in the prior art piezoelectric filter, respectively;

FIGS. 4(b), 5(i b) and 6(b) are respective end views of the terminal members shown in FIGS. 4(a), 5(a) and 6(a);

DETAILED DESCRIPTION OF THE INVENTION

Figure 7:
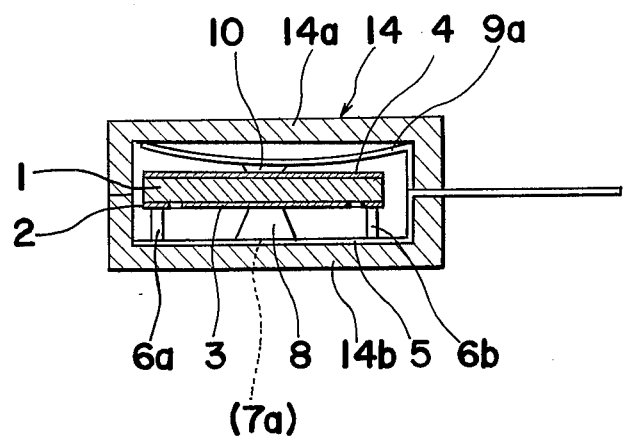
FIG. 7 is a side sectional view of the prior art piezoelectric filter in the assembled condition.

Before the description of the present invention proceeds, it is to be noted that like parts are designated by like reference numerals throughout the accompanying drawings.

Figure 9A:
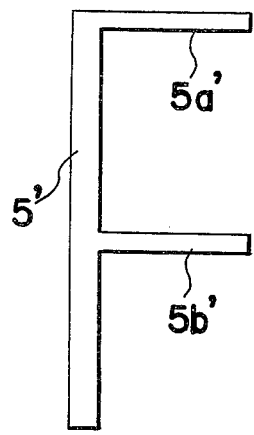
FIGS. 9(a), 10(a) and 11(a) are views similar to FIGS. 4(a), 5(a) and 6(a), showing first, second and common terminal members employed in a piezoelectric filter according to the present invention, respectively.
Figure 10A:
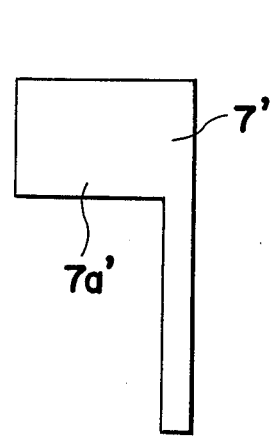
Figure 11A:
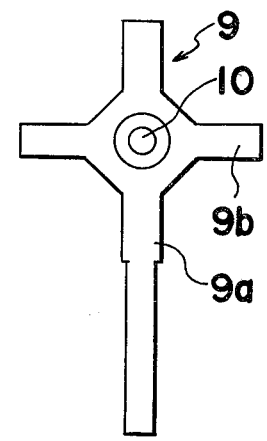
Figure 9B:
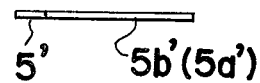
FIGS. 9(b), 10(b) and 11(b) are views similar to FIGS. 4(b), 5(b) and 6(b), showing the first, second and common terminal members shown in FIGS. 9(a), 10(a) and 11(a), respectively.
Figure 10B:
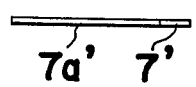
Figure 11B:
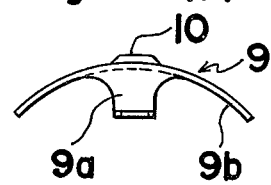

Referring to FIGS. 9 to 11, it will readily be seen that, while the common terminal member 9 employed in the present invention is identical in construction to that employed in the prior art filter such as shown in FIG. 7, the first and second terminal members 5' and 7' employed in the present invention differ from the first and second terminal members shown respectively in FIGS. 4 and 5. The terminal member 5 employed in the present invention has a pair of flat tongues 5a' and 5b' and the terminal member 7' employed in the present invention has no a contact protuberance, unlike the terminal member 7 employed in the prior art filter. In addition, the terminal members 5', 7' and 9 employed in the present invention may be made of any unresilient electroconductive metallic material.

Figure 12:
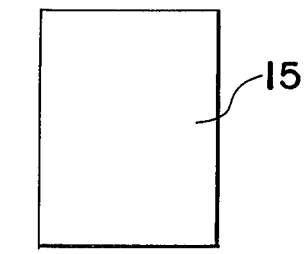
FIG. 12 is a plan view of a direction-oriented electroconductive sheet employed in the piezoelectric filter according to the present invention.
Figure 13:
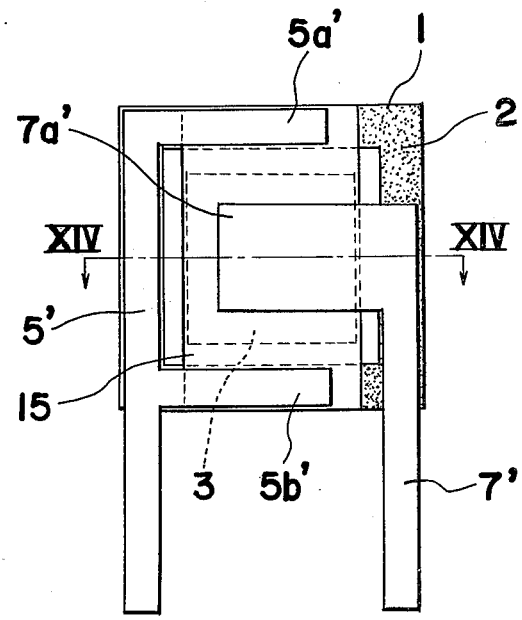
FIG. 13 is a front elevational view of an assembly including the piezoelectric substrate, the first terminal member, the second terminal member, the common terminal member and the direction-oriented electroconductive plastic sheet, all of which are employed in the piezoelectric filter according to the present invention.
Figure 14:
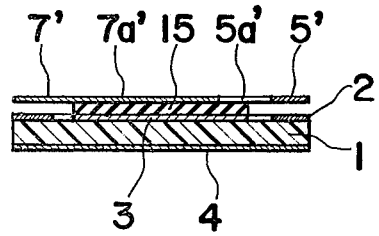
FIG. 14 is a cross-sectional view taken along the line XIV—XIV in FIG. 13.

Shown in FIG. 12 is a direction-oriented electroconductive plastic sheet 15 of, for example, a substantially rectangular shape having a width equal to the width of the square-shaped center electrode layer 3 and a length equal to the width of the square shaped piezoelectric substrate 1. As best shown in FIGS. 13 and 14, this direction-oriented electroconductive sheet 15 is placed on the piezoelectric substrate 1 so as to overlie the center electrode layer 3 and the opposite side portions of the outer electrode layer 2. The tongues 5a' and 5b' are to be electrically connected with the outer electrode layer 2 through the direction oriented electroconductive plastic sheet 15 when in the assembled condition shown in FIG. 15.

Because of the employment of the unique electroconductive property of the plastic sheet 15, which is conductive only across its thickness, the outer electrode layer 2 is electrically connected only to the tongues 5a' and 5b' of the first terminal member 5' through the end portions of the direction oriented electroconductive plastic sheet 15. The center electrode layer 3 is electrically connected only to the arm 7a' of the second terminal member 7' through the roughly central portion of the plastic sheet 15. It is, however, to be noted that, if the direction-oriented electroconductive sheet 15 is so wide that it extends under the elongated portion of the second terminal member 7', undesirable electric short-circuiting may occur between the outer electrode layer 2 and the center electrode layer 3.

Figure 15:
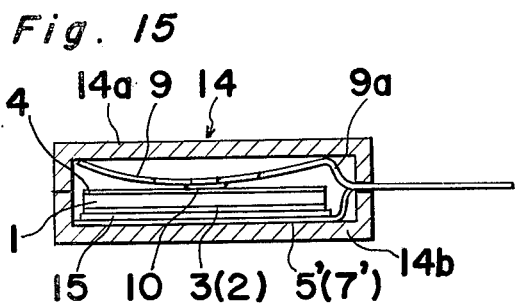
FIG. 15 is a side cross-sectional view of the piezoelectric filter of the present invention in an assembled condition.

Referring now to FIG. 15, the assembly shown in FIGS. 13 and 14 is housed within the casing 14 together with the common terminal member 9. In the assembled condition of the filter, shown in FIG. 15, the assembly shown in FIGS. 13 and 14 is positioned within the casing 14 in such a manner that the first and second terminal members 5' and 7' are held in contact with the bottom of the lower casing half 14b while the common terminal member 9 is positioned in a space defined between the ground electrode layer 4 and the upper casing half 14a. The resilience of common terminal member 9 exerts a force on the assembly of FIGS. 13 and 14 through the contact protuberance 10, which electrically contacts the ground electrode layer 4 and is aligned with the center electrode layer 3.

Figure 8:
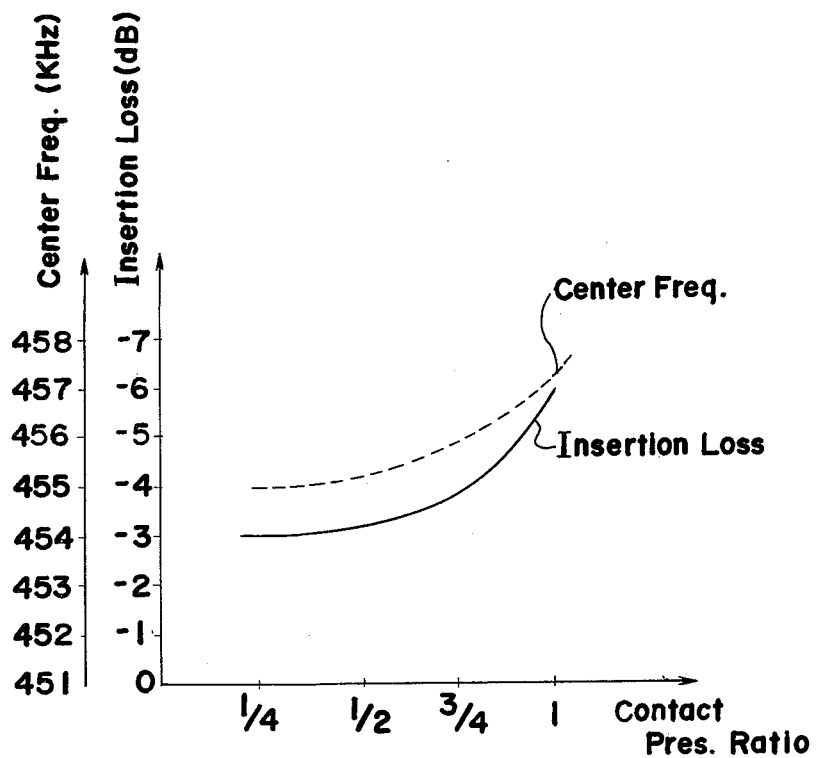
FIG. 8 is the graph showing the relationship between the contact pressure ratio and variation of the insertion loss and the center frequency.
Figure 16:
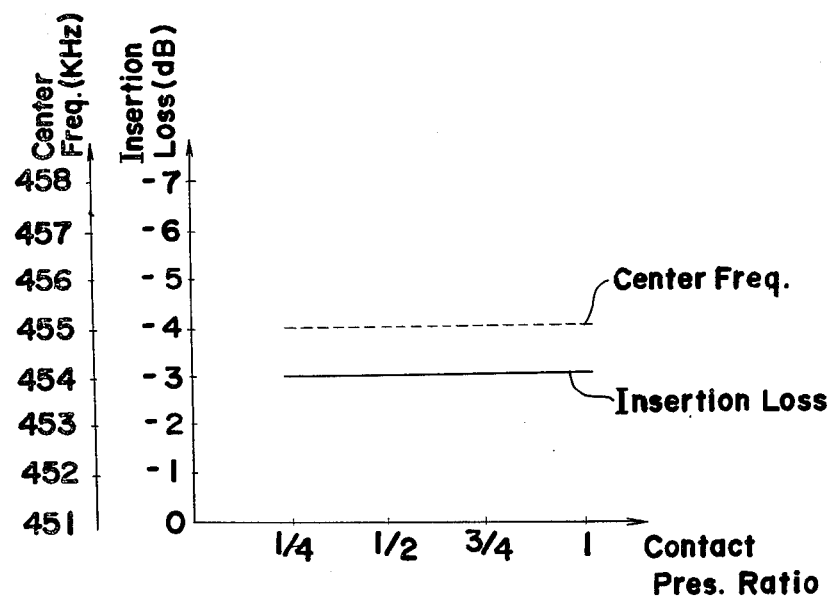
FIG. 16 is a graph similar to that shown in FIG. 8, but pertaining to the device of the present invention.

In the piezoelectric filter according to the present invention that has been described with reference to and shown in FIGS. 9 to 15, as can readily be seen from FIG. 16 which is a graph corresponding to that shown in FIG. 8, even if the pressure of contact of the tongues 5a' and 5b' on the piezoelectric substrate 1 is increased to a value higher than that in the prior art filter of a similar kind, neither the insertion loss nor the center frequency varies substantially. At worst, variation in insertion loss is within the range of 1/5 to 1/10 of the amount of variation in the insertion loss occurring in the prior art filter, and variation in center frequency is within the range of 1/10 to 1/15 of the amount of variation in the center frequency occurring in the prior art filter.

In the foregoing embodiments, the first and second terminal members 5' and 7' have been described and shown as being separate members. However, both can be assembled into a single unit, which will now be described with reference to FIG. 17.

Figure 17:
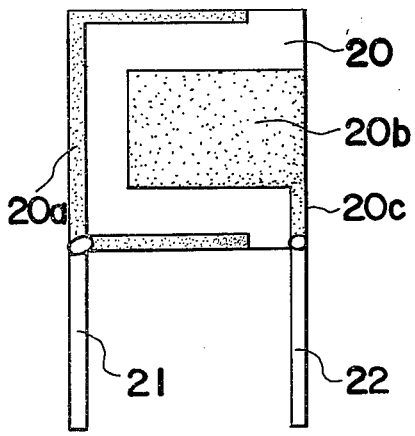
FIG. 17 is a view similar to FIG. 4, showing modified forms of the first and second terminal members according to the present invention.

The terminal assembly shown in FIG. 17 comprises an electrically insulating plate 20 of square configuration having one surface formed with a first electrode layer 20a, of substantially U-shaped configuration, and a second electrode layer 20b, of substantially L-shaped configuration and having an electrode leg portion 20c. The formation of these electrode layers 20a, 20b and 20c on the surface of the insulating plate 20 can be carried out by the use of any known electric circuit printing technique. The terminal assembly further comprises first and second terminal strips 21 and 22. The first terminal strip 21 has one end soldered to the first electrode layer 20a and the second terminal strip 22 has one end soldered to the free end of the electrode leg portion 20c, first and second terminal strips 21 and 22 extending outwards from the printed circuit plate 20 parallel to each other. It is to be noted that the combination of the first electrode layer 20a and the first terminal strip 21 and the combination of the second electrode layer 20b and the second terminal strip 22 correspond in function respectively to the first and second terminal members 5' and 7' best shown in FIGS. 9 and 10.

Figure 18:
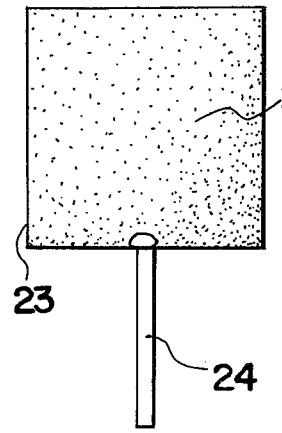
FIGS. 18 and 19 are front elevational views of modified forms of the common terminal member according to the present invention.

As a common terminal member corresponding in function to the common terminal member 9 best shown in FIG. 6, there is preferably employed in combination with the terminal assembly shown in FIG. 17 a member in the form of an electrode-printed plate 23 of substantially square shape having formed on one surface an electrode layer 23a. One end of a terminal strip 24 is soldered to the electrode layer 23a (FIG. 18). Alternatively, this common terminal member may comprise a flat electroconductive plate member 25 having a substantially square body portion 25a and a leg portion 25b (FIG. 19).

Figure 20:
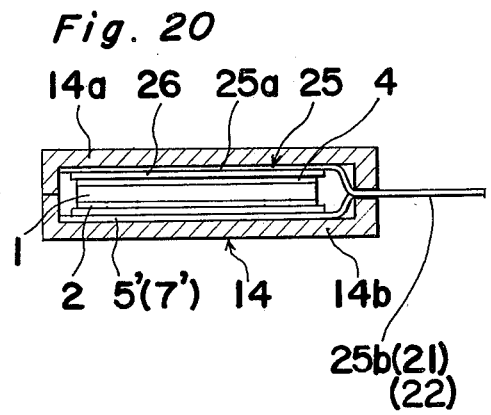
FIG. 20 is a view similar to FIG. 15, showing the piezoelectric filter of the present invention wherein the modified common terminal member shown in FIG. 19 is employed.
Figure 19:
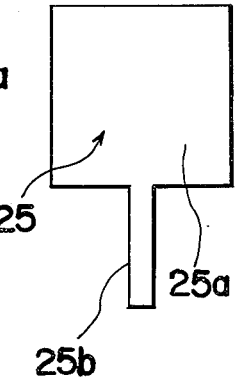

A complete piezoelectric filter utilizing the common terminal member of the construction shown in FIG. 19 is shown in FIG. 20 with the casing 14 shown in section. Where the common terminal member comprising the flat electroconductive plate member 25 is employed as shown in FIG. 20, the use of a sheet-like elastic electroconductive connector 26 is preferred. This electroconductive connector 26 may be either an ordinary electroconductive plastic sheet or a direction-oriented electroconductive plastic sheet.

The piezoelectric filter constructed according to the present invention has the following advantages. Since at least the first and second terminal members are flat, not only is the piezoelectric filter compact, but also the manufacture of the piezoelectric filter of relatively small thickness is possible.

Because of the utilization of the direction-oriented electroconductive plastic sheet, the relatively complicated design of the terminal members to provide the necessary resilience, as in the prior art piezoelectric filter shown in FIG. 7, is no longer required, thus simplifying the design and construction of the piezoelectric filter of the present invention.

In the prior art filter, the resilient force to be exerted by the elastic tongues 5a and 5b on the outer electrode layer 2 must not be excessive, so that the first terminal member should not be of a thickness larger than 0.1 mm. As a result, the first terminal member employed in the prior filter suffers from the defect of mechanical weakness. Consequently, the prior art filter is susceptible to change in performance under the influence of vibrations and impacts. However, in the present invention, because of the employment of the direction-oriented electroconductive plastic sheet, even though the first terminal member is held in excellent contact with the outer electrode layer 2, no substantial variation in insertion loss or in center frequency occurs in the piezoelectric filter.

In view of the foregoing features, the first terminal member employed in the filter of the present invention may be thicker than that in the prior art filter, with the result that the physical strength of the first terminal member employed in the filter of the present invention can be increased.

Furthermore, in the present invention, because of the employment of the direction-oriented electroconductive plastic sheet 15, the first terminal member need not be precisely positioned relative to the outer electrode layer, as is required in the manufacture of the prior art filter, and, therefore, the manufacture of the piezoelectric filter according to the present invention can be automated which utlimately reduces the manufacturing cost.

Although the direction-oriented electroconductive plastic sheet 15 has been described as having a rectangular shape, it may have any desired shape so long as, when used, it does not permit a shortcircuit between the outer electrode layer 2 and the center electrode layer 3. Furthermore, the piezoelectric substrate and its associated component parts may have any desired shape.

Although the present invention has fully been described in connection with the preferred embodiments thereof with reference to the accompanying drawings, many variations and modifications will now be apparent to those skilled in the art. The scope of the invention is therefore to be limited not by the details of the preferred embodiments described herein, but only by the terms of the appended claims.

I claim:

1. A piezoelectric filter comprising:
    a casing;
    a piezoelectric substrate accommodated in said casing and having first and second opposing major surfaces, said piezoelectric substrate further having a first and a second electrode layer formed on said first surface and electrically insulated from each other, and said substrate further having a common electrode layer formed on said second surface;
    a first flat terminal means disposed between said first surface of said piezoelectric substrate and one portion of said casing, said first terminal means having one end extending outside said casing and the other end in electrical contact with said first electrode layer;
    a second flat terminal means disposed between said first surface of the piezoelectric substrate and said one wall portion of said casing, said second terminal means having one end extending outside said casing and the other end in electrical contact with said second electrode layer;
    a common terminal means disposed between said second surface of said piezoelectric substrate and a second wall portion of said casing, said common terminal means having one end extending outside said casing and the other end in electrical contact with said common electrode layer; and
    a unitary direction-oriented electroconductive plastic sheet disposed on and in electrical contact with said first and second electrode layers and between said electrode layers and said first and second terminal means, said direction-oriented electroconductive plastic sheet having, when said filter is in operation, substantial electroconductivity only in the direction perpendicular to said first major surface, and said first and second terminal means being in electrical contact with said first and second electrode layers, respectively, through different, non-overlapping portions of said direction-oriented electroconductive plastic sheet, said unitary direction-oriented electroconductive plastic sheet being situated between said first and second electrode layers and said first and second terminal means such that said first and second terminal means are in contact with a substantial portion of the surface of said first and second electrode layers, respectively.

2. A piezoelectric filter as claimed in claim 1, further comprising a second electroconductive plastic sheet disposed between and in electrical contact with both said common terminal means and said common electrode layer.

3. A piezoelectric filter as claimed in claim 1, wherein said first terminal means comprises a generally elongated first terminal member having at least two spaced flat tongues in electrical contact, through said first direction-oriented electroconductive plastic sheet, with said first electrode layer, and wherein said second terminal means comprises a generally elongated second terminal member having an arm portion in electrical contact with said second electrode layer through said first direction-oriented electroconductive plastic sheet.

4. A piezoelectric filter as claimed in claim 1 or 3, wherein a portion of each of said first and said second terminal means is comprised of a first and a second terminal electrode layer, respectively, printed on one surface of a first plate member, and wherein respective said ends of said first and second terminal means extending outside said casing comprise, respectively, first and second terminal strips, connected at one end to said first and second terminal electrode layers, respectively.

5. A piezoelectric filter as claimed in claim 4, wherein one portion of said common terminal means comprises a common terminal electrode layer printed on one surface of a second plate member, and said end of said common terminal means that extends outside said casing comprises a common terminal strip that is connected at one end to said common terminal electrode layer.

6. A piezoelectric filter as claimed in claim 4, wherein said common terminal means comprises a terminal plate member having a body portion, in electrical contact with said common electrode layer through said direction-oriented electroconductive plastic sheet, and a leg portion integral with said body portion and extending outside said casing.

7. A piezoelectric filter as claimed in claim 3, wherein each of said at least two spaced flat tongues is in electrical contact, through said first direction-oriented electroconductive plastic sheet, with a different, non-overlapping portion of said first electrode layer and wherein said second electrode layer is located between said non-overlapping portions of said first electrode layer and wherein said first direction-oriented electroconductive plastic sheet extends from one of said non-overlapping portions to said first electrode layer and then to the other of said non-overlapping portions.

8. A piezoelectric filter as claimed in claim 7, wherein said spaced flat tongues are parallel.

* * * * *